United States Patent [19]

Coffin

[11] Patent Number: 4,636,723
[45] Date of Patent: Jan. 13, 1987

[54] TESTING DEVICE FOR PRINTED CIRCUIT BOARDS

[76] Inventor: Harry S. Coffin, 1801 Linden Way, King of Prussia, Pa. 19406

[21] Appl. No.: 842,599

[22] Filed: Mar. 21, 1986

[51] Int. Cl.$^4$ .................. G01R 31/02; G01R 1/06
[52] U.S. Cl. ...................... 324/158 F; 324/73 PC; 324/158 P
[58] Field of Search ........... 324/73 PC, 158 P, 158 F; 339/75 M, 108 TP, 117 P, 117 R

[56] References Cited

U.S. PATENT DOCUMENTS

| | | | |
|---|---|---|---|
| 3,089,925 | 5/1963 | Landstrom et al. | 339/75 M |
| 4,115,735 | 9/1978 | Stanford . | |
| 4,164,704 | 8/1979 | Kato et al. . | |
| 4,230,985 | 10/1980 | Matrone et al. . | |
| 4,321,533 | 3/1982 | Matrone . | |
| 4,496,903 | 1/1985 | Paulinski . | |
| 4,536,051 | 8/1985 | Smith et al. | 324/158 F |

OTHER PUBLICATIONS

"Testing Apparatus with Selectable Probes and Contactors for Use with Changeable Patterns", by Faure et al., IBM Tech. Disc. Bull., 2/78, vol. 20, #9, pp. 3461-3462.

*Primary Examiner*—Reinhard J. Eisenzopf
*Assistant Examiner*—B. Burns
*Attorney, Agent, or Firm*—Eugene Chovanes

[57] ABSTRACT

A two level test device for testing printed circuit boards is disclosed, including a housing defining an open chamber and a support platform displaceably connected with the housing for closing the chamber and for supporting the circuit board to be tested. A vacuum device is connected with the housing for creating a negative pressure within the chamber to displace the platform from a first rest position to second and third test positions. In the platform second position, the circuit board contacts the terminal of a test pin for functional testing of the board and in the platform third position, the circuit board contacts the terminals of a pair of test pins for in-circuit testing of the circuit board. The test device is characterized by a stop plate for arresting displacement of the platform in its second and third positions. The stop plate includes a plurality of projections and the housing bottom wall contains a plurality of recesses corresponding with the projections. When the stop plate is in a first position, the projections engage the upper surface of the housing bottom wall to stop the platform displacement in its second position. When the stop plate is laterally shifted to a second position, the projections enter the corresponding recesses and the lower surface of the stop plate abuts against the upper surface of the housing bottom wall to stop the platform displacement in its third position. A piston/cylinder assembly shifts the stop plate between the first and second positions.

6 Claims, 6 Drawing Figures

TESTING DEVICE FOR PRINTED CIRCUIT BOARDS

BACKGROUND OF THE INVENTION

With the development of the printed circuit board, the need arises for automatic functional and in-circuit testing thereof prior to its installation in electrical hardware. Generally, in a functional test, the function of the entire circuit is tested whereas in an in-circuit test, individual components are tested.

The present invention relates to an automatic test device for printed circuit boards which is capable of both functional and in-circuit testing. More particularly, the invention relates to an improved vacuum operated test device which accurately positions a circuit board to be tested in first and second test positions corresponding with the functional and in-circuit tests, respectively.

BRIEF DESCRIPTION OF THE PRIOR ART

Vacuum operated automatic test devices for drawing a circuit board to be tested into contact with one or more testing probes are well known in the patented prior art as evidenced by the to Stanford U.S. Pat. No. 4,115,735, Kato et al U.S. Pat. No. 4,164,704, Matrone et al U.S. Pat. No. 4,230,985, Matrone U.S. Pat. No. 4,321,533, and Paulinski U.S. Pat. No. 4,496,903.

There are also vacuum operated test devices on the market for functional and in-circuit testing of printed circuit boards. The Pylon Company, Inc., for example, manufactures the Vacuum Controller and O-B Test Group, Inc. manufactures a Dual Level Vacuum Test Fixture. Both devices includes a lower probe board having two probes embedded therein. Typically, one of the probes is of a telescoping nature wherein its contact extends beyond the contact of the other probe. The test devices also include a diaphragm board arranged parallel to and normally spring-biased away from the probe board. A diaphragm rests on the diaphragm board and supports the printed circuit board to be tested. The diaphragm board and diaphragm each contain aligned openings to receive the contacts of the probes. A vacuum pump sucks air from beneath the diaphragm board to draw the printed circuit board downwardly into contact with the first extended probe for a functional test. Subsequent downward movement of the board by the vacuum against the biasing force of the spring brings the board into contact with the second probe contact for an in-circuit test.

In the vacuum controller of the Pylon Company, Inc. a single vacuum source provides the vacuum for drawing the diaphragm board and hence the circuit board downwardly. The vacuum is arrested or held steady in the functional test position so that the circuit board moves neither upwardly or downwardly. This requires a delicate maintenance of the vacuum which is difficult to achieve since there are leaks through the circuit board and around the circuit board where it is in contact with the diaphragm. Hence, if the vacuum pump pulls too strongly to overcome the leaks, the board moves downwardly. On the other hand, if the pump does not exert a sufficient vacuum, the leaks permit the board to move upwardly owing to the biasing force of the springs. This movement of the board causes it to fluctuate in and out of the contact with the probe contact during the functional test, resulting in poor test results.

The O-B Test Group attempts to overcome this drawback by providing two separate vacuum chamber and two separate diaphragm boards. One vacuum chamber moves the circuit board to the functional test position and the other vacuum chamber moves the board to the in-circuit test position. A number of major drawbacks of this device include the added complexity and costs required to provide the additional vacuum source and diaphragm board as well as the requirement of additional sealing devices between the diaphragm boards.

The present invention was developed in order to overcome these and other drawbacks of the prior devices by providing a two level printed circuit board test device which enables a circuit board to be accurately held in either of two test positions using a single vacuum source.

SUMMARY OF THE INVENTION

Accordingly, it is a primary object of the present invention to provide an improved device for functional and in-circuit testing of printed circuit boards. The device includes a housing having bottom and side walls which define an open chamber. The bottom wall contains a pair of openings for receiving first and second test pins having terminals which extend into the chamber. The first test pin includes a spring biased terminal which extends a greater distance into the chamber than the terminal of the second test pin. The housing bottom wall also contains a plurality of recesses. A support platform is slidably connected with the housing for supporting the circuit board to be tested. The platform is parallel to and normally spaced from the bottom wall to close the chamber and contains a pair of openings aligned with the openings in the bottom wall. A vacuum source is connected with the housing for displacing the platform relative to the bottom wall between first, second, and third positions successively closer to the housing bottom wall. A stop plate is arranged within the chamber adjacent the lower surface of the platform and is displaceable therewith. The stop plate contains an enlarged opening for receiving the terminals of the first and second test pins and the lower surface of the plate includes a plurality of projections corresponding with the recesses in the housing bottom wall. A piston/cylinder assembly is connected with the stop plate for laterally displacing the plate within the chamber between a first position wherein the projections are out of alignment with the bottom wall recesses and a second position wherein the projections are aligned with the recesses. When the platform and stop plate are in the first positions, the first and second pin terminals are spaced from the circuit board. When the platform is displaced toward the housing bottom wall, the stop plate projections engage the bottom wall upper surface to arrest the movement of the platform in its second position wherein the first test pin terminal contacts the circuit board for functional testing. When the stop plate is displaced to its second position, the projections enter the recesses and the platform is displaced to its third position wherein the first and second test pin terminals contact the circuit board for in-circuit testing.

According to a further object of the invention, the piston contains an opening and a rod is arranged parallel to the test pins with one end connected with the stop plate. The other end of the rod passes through the piston opening to connect the piston with the stop plate. When the platform is displaced between the first, second and third positions, the rod slidingly passes through the piston opening.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
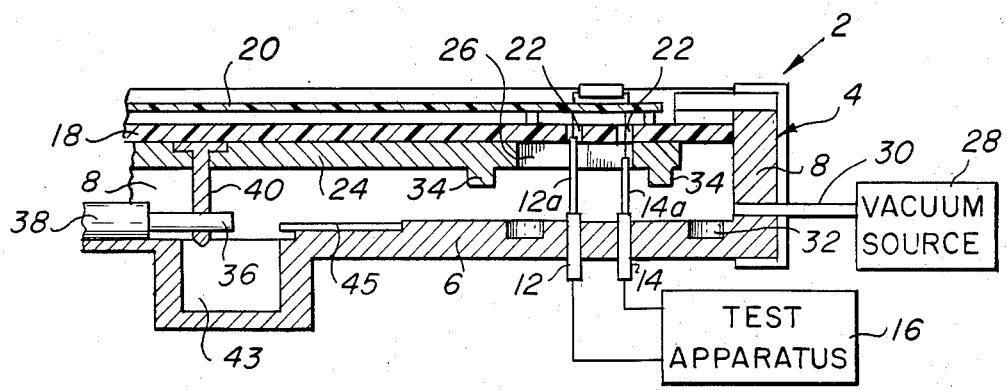
FIGS. 1, 2, and 3 are side sectional views of the circuit board testing device according to the invention in its rest, functional test, and in-circuit test positions, respectively.

Referring first to FIG. 1, the improved two level testing device 2 for printed circuit boards according to the invention is shown in its rest position. The device includes a housing 4 having a horizontal bottom wall 6 and a plurality of side walls 8 connected with opposite edges of the bottom wall and extending vertically therefrom to define an open-topped chamber. As shown in the drawing, the bottom and side walls of the housing are preferably formed as an integral assembly.

Figure 6:
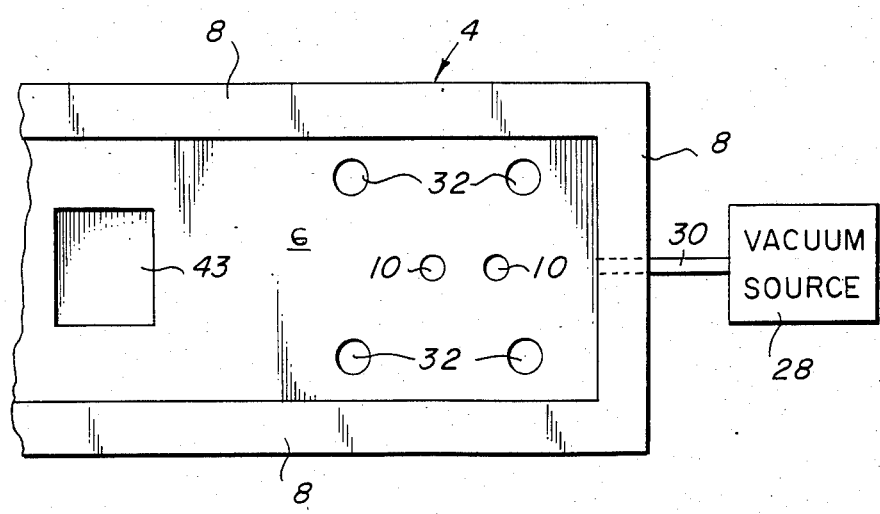
FIG. 6 is a partial top plan view of the housing of the invention.

The housing bottom wall 6 contains at least two openings 10, as shown more particularly in FIG. 6, adapted to receive a pair of test pins including a first pin 12 and a second pin 14. Each test pin includes a terminal portion 12a, 14a which extends into the housing chamber. At least one test pin terminal (i.e. the first terminal portion 12a) is spring biased and extends into the chamber at a greater distance than the terminal portion 14a of the second test pin. The test pins are connected with a test apparatus 16 as will be discussed in greater detail below.

Figure 4:
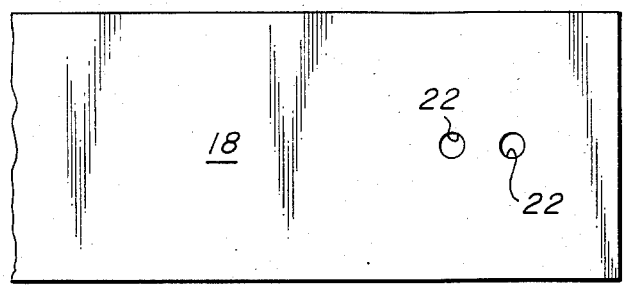
FIG. 4 is a partial top plan view of the platform of the invention.

A generally planar horizontal support platform 18 is slidably connected with the housing 4 and extends between the side walls 8 thereof for supporting a printed circuit board 20 to be tested. As shown in FIG. 1, the platform is arranged parallel to the housing bottom wall 6 and is normally spaced from the bottom wall to close the open upper end of the chamber. The platform also contains at least two openings 22 as shown in FIG. 4 aligned with the openings 10 in the housing bottom wall. In this manner, the platform openings are also aligned with the test pins and are adapted to receive the terminal portions 12a, 14a thereof as will be discussed below.

Figure 5:
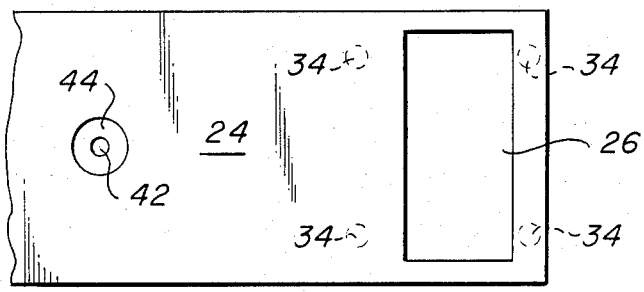
FIG. 5 is a partial top plan view of the stop plate of the invention.

A horizontal, planar stop plate 24 or frame is arranged in the housing chamber in contiguous relation with the lower surface of the platform 18 and is displaceable with the platform relative to the fixed housing. The stop plate contains an enlarged opening 26 as shown in FIG. 5 generally aligned with the openings in both the housing bottom wall 6 and the platform 18. The terminals 12a, 14a of the first and second test pins thus pass through the enlarged opening 26 in the stop plate.

As set forth above, the support platform 18 is slidably connected with the housing 4. A vacuum source 28 is connected with the housing via a line 30 which communicates with the housing chamber to control the volume of air and hence, the pressure, within the chamber. Because the chamber is sealed by the housing 4 and the platform 18, but for the openings 22 in the platform, a negative pressure within the chamber resulting from suction of air from the chamber by the vacuum source causes the platform (as well as the stop plate 24 and the printed circuit board 20) to be displaced downwardly toward the housing bottom wall 6. Conversely, a positive pressure within the chamber resulting from the supply of air to the chamber causes the platform, the stop plate, and the circuit board to be displaced upwardly away from the housing bottom wall. If desired, a compression spring (not shown) may also be provided to normally bias the stop plate, the platform, and the circuit board upwardly to the rest position shown in FIG. 1. The vacuum source 28 is thus operable to displace the platform 18 between first, second, and third positions shown in FIGS. 1, 2, and 3, respectively. In the first or rest position, the platform is at its greatest distance from the housing bottom wall. In the second and third positions, the platform is progressively closer to the housing bottom wall as shown.

As shown in FIGS. 1, 2, 3, and 6, the upper surface of the housing bottom wall 6 contains a plurality of recesses 32 and the lower surface of the stop plate 24 includes a plurality of projections 34 corresponding with the recesses. The projections and recesses cooperate to mechanically arrest the platform 18 in its second and third positions as will be set forth in greater detail below.

Figure 2:
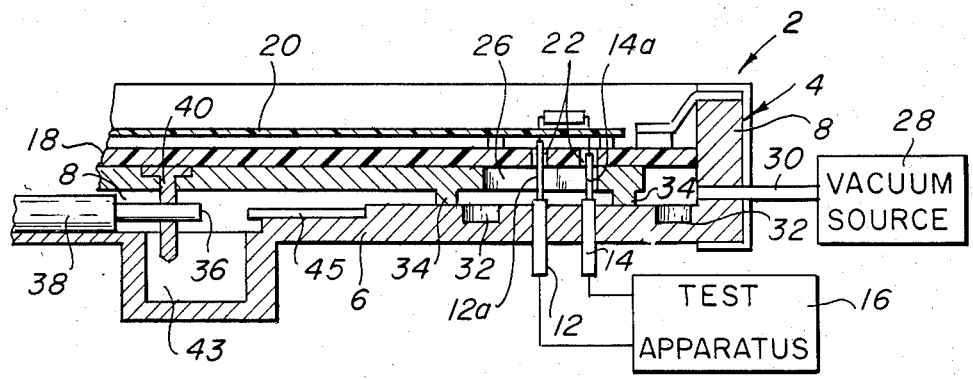
Figure 3:
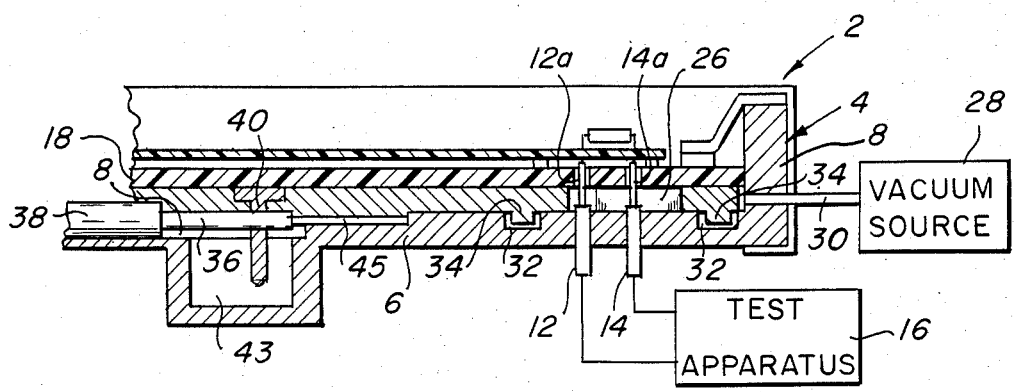

A piston 36 and cylinder 38 assembly is arranged within the housing chamber and is operable to displace the stop plate 24 laterally between a first position shown in FIGS. 1 and 2 and a second position shown in FIG. 3. More particularly, when the stop plate 24 is in its first position, the projections 34 are out of alignment with the bottom wall recesses 32 and when the stop plate 24 is in its second position, the projections are aligned with the bottom wall recesses.

A vertically arranged rod 40 is provided for connecting the piston 36 with the stop plate. For example, the stop plate 24 contains a rod opening 42 surrounded by a beveled surface 44 for receiving a head end portion 40a of the rod which in essence is connected with the stop plate. The piston includes an opening for slidingly receiving the lower or tail end portion 40b of the rod. Thus as the piston 36 is extended and retracted, the rod 40 is shifted between its first and second positions.

OPERATION

With the test device in the rest position of FIG. 1, a printed circuit board is mounted on the support platform 18 with exposed contacts of the board to be tested arranged above the openings 22 in the platform in alignment with the pair of test pins 12, 14. While the invention has been described as having at least one pair of openings in the housing bottom wall and platform for receiving at least one pair of test pins, it will be apparent to those skilled in the art that any number of pairs of test pins may be provided to test the printed circuit board or to simultaneously test a plurality of boards.

The vacuum source 28 is energized to remove air from the housing chamber by suction, whereby the platform 18 is slidingly displaced downwardly relative to the housing until the projections 34 of the stop plate 24 engage the upper surface of the housing bottom wall as shown in FIG. 2 wherein the platform reaches its second position and one of the exposed contacts of the circuit board engages the first test pin terminal portion 12 via the opening 26 in the stop plate and the opening 22 in the platform. During displacement of the platform from its first to its second position, the rod 40 connected with the stop plate 24 slides downwardly through the opening in the piston 36. The lower portion 40b of the rod extends into a depressed well 43 provided in the housing bottom wall 6 as shown in FIG. 2.

With the platform in the second position shown in FIG. 2, the test apparatus is energized to functionally test the printed circuit board 20 via the first test pin 12.

At the end of the functional test period, the cylinder 38 is energized to extend the piston 36 against a stop 45 to laterally displace the stop plate from its first position to its second position. Because the vacuum source has created a negative pressure within the chamber, the platform is displaced from its second position to its third position since the projections 34 of the stop plate are now received by the recesses 32 provided in the housing bottom wall upper surface as shown in FIG. 3. Displacement of the platform is arrested in its third position when the lower surface of the stop plate abuts against the upper surface of the housing bottom wall. During displacement of the platform between its second and third positions, the stop plate 24 and the circuit board 20 are also similarly displaced. Moreover, the spring biased terminal portion 12a of the first test pin 12 is depressed and the other exposed contact of the circuit board engages the terminal 14a of the second test pin 14. The test apparatus is then operated to perform in-circuit testing of the printed circuit board 20 under test via both pins 12, 14 of the pair of pins.

In accordance with the invention, only one vacuum source is required to produce continuous negative pressure within the housing chamber to displace the platform from its first through its second, to its third position. As opposed to the prior devices, the vacuum source is not controlled to maintain the platform in its second and third testing positions. Rather, the stop plate and the housing bottom wall, together with the corresponding and cooperating projections and recesses are provided to mechanically accurately maintain the platform in its second and third positions without deviating therefrom for accurate testing.

The test device may be made from any suitable material which is not permeable to air. The housing and stop plate are preferably formed of a rigid metal such as an aluminum alloy or stainless steel. The platform may also be formed of stainless steel or preferably of a synthetic plastic or ceramic material.

While in accordance with the provisions of the Patent Statutes the preferred forms and embodiments have been illustrated and described, it will be apparent to those skilled in the art that various changes or modifications may be made without deviating from the inventive concepts set forth above.

What is claimed is:

1. Apparatus for functional and in-circuit testing of printed circuit boards, comprising
   (a) a fixed housing including a bottom wall and a plurality of side walls arranged normal to and connected with said bottom wall to define an open chamber, said bottom wall containing at least first and second openings, and an upper surface of said housing bottom wall containing a plurality of recesses;
   (b) a generally planar support platform slidably connected with said housing for supporting a circuit board to be tested, said platform being arranged parallel to and spaced from said housing bottom wall and extending between said side walls to close said chamber, said platform containing at least first and second openings aligned with said first and second bottom wall openings, respectively;
   (c) means for displacing said platform relative to said housing bottom wall between first, second and third positions, the spacing between said platform and said housing bottom wall decreasing between said first, second and third positions;
   (d) a stop plate arranged within said chamber adjacent a lower surface of said platform and displaceable therewith, said stop plate containing an enlarged opening aligned generally with said housing bottom wall and platform openings, the lower surface of said stop plate including a plurality of projections corresponding with said bottom wall recesses;
   (e) first and second test pin means extending through said bottom wall first and second openings into said chamber and aligned with said stop plate enlarged opening and said platform first and second openings, respectively, at least said first test pin means including a spring-biased terminal, said first test pin terminal normally extending a first distance into said chamber and said second test pin terminal normally extending a second distance into said chamber, said second distance being less than said first distance; and
   (f) means for displacing said stop plate laterally within said chamber between a first position wherein said projections are out of alignment with said bottom wall recesses and a second position wherein said projections are aligned with said recesses, whereby when said platform and said stop plate are in said first positions, respectively, said first and second pin terminals are spaced from the circuit board, and when said platform displacing means are energized to displace said platform toward said bottom wall, said stop plate projections engage said bottom wall upper surface to arrest displacement of said platform in said platform second position wherein said first test pin terminal contacts the circuit board for functional testing, and when said stop plate displacing means are energized to displace said stop plate to its second position, said projections enter said recesses and said platform is displaced to its third position wherein said stop plate lower surface engages said bottom wall upper surface, and further wherein said first and second test pin terminals contact the circuit board for in-circuit testing thereof.

2. Apparatus as defined in claim 1, wherein said platform displacing means comprises a vacuum source connected with said housing for controlling a quantity of air within said chamber, said platform being displaced from its first position toward its second and third positions when air is removed from said chamber and from its third position toward its first position when air is supplied to said chamber.

3. Apparatus as defined in claim 2, wherein said stop plate displacing means comprises a piston/cylinder assembly, said piston being connected with said stop plate.

4. Apparatus as defined in claim 3, and further comprising means for connecting said piston with said stop plate.

5. Apparatus as defined in claim 4, wherein said piston contains an opening, and further wherein said connecting means comprises a rod arranged parallel to said test pin means and connected at one end with said stop plate, the other end of said rod passing through said piston opening, whereby when said platform is displaced between said first, second, and third positions, said rod slidingly passes through said piston opening.

6. Apparatus as defined in claim 5, wherein said housing bottom wall contains a depressed well portion generally aligned with said rod for receiving said other end thereof when said platform is displaced from said first position toward said second and third positions.

* * * * *